(12) United States Patent
Sun et al.

(10) Patent No.: US 12,287,544 B2
(45) Date of Patent: Apr. 29, 2025

(54) DISPLAY APPARATUS

(71) Applicants: BOE MLED Technology Co., Ltd., Beijing (CN); BOE Technology Group Co., Ltd., Beijing (CN)

(72) Inventors: Jiwei Sun, Beijing (CN); Hongli Zhu, Beijing (CN); Yubiao Li, Beijing (CN); Jiaxin Li, Beijing (CN); Kun Lu, Beijing (CN); Honghao Yu, Beijing (CN); Donglei Li, Beijing (CN)

(73) Assignees: BOE MLED Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/270,847

(22) PCT Filed: Jul. 26, 2022

(86) PCT No.: PCT/CN2022/108018
§ 371 (c)(1),
(2) Date: Jul. 4, 2023

(87) PCT Pub. No.: WO2024/020800
PCT Pub. Date: Feb. 1, 2024

(65) Prior Publication Data
US 2024/0377678 A1    Nov. 14, 2024

(51) Int. Cl.
G02F 1/13357    (2006.01)
G02F 1/1333     (2006.01)
G09G 3/34       (2006.01)

(52) U.S. Cl.
CPC .. *G02F 1/133603* (2013.01); *G02F 1/133308* (2013.01); *G09G 3/3426* (2013.01); *G09G 2320/0233* (2013.01)

(58) Field of Classification Search
CPC .. G09G 2320/0233; G09G 3/342–3426; G02F 1/133603; G02F 1/133308
See application file for complete search history.

(56) References Cited

U.S. PATENT DOCUMENTS

2017/0142793 A1    5/2017    Liu

FOREIGN PATENT DOCUMENTS

| CN | 104361830 A | * | 2/2015 | ............ F21V 19/00 |
|----|-------------|---|--------|-------------------------|
| CN | 104932144 A | * | 9/2015 | ........... G02F 1/1333 |
| CN | 104977755 A |   | 10/2015 | |
| CN | 207281425 U |   | 4/2018 | |
| CN | 114488598 A |   | 5/2022 | |
| JP | 2010266603 A |  | 11/2010 | |
| TW | 1548916 B   | * | 9/2016 | |

* cited by examiner

*Primary Examiner* — Mariceli Santiago
(74) *Attorney, Agent, or Firm* — IPro, PLLC

(57) ABSTRACT

In a backlight module of a display apparatus, the base substrate is a flat plate structure, so that the backlight module can be prevented from being subjected to a bending internal stress, thereby avoiding a damage to the backlight module and ensuring a yield of the display apparatus. At the same time, the difference of backlight brightness provided by the backlight module to different regions of the display panel is smaller, so that brightness uniformity of different regions of the display apparatus can be ensured, and a display effect of the display apparatus is better.

15 Claims, 5 Drawing Sheets

DISPLAY APPARATUS

CROSS-REFERENCE TO RELATED APPLICATION

This application is a US national stage of international application No. PCT/CN2022/108018, filed on Jul. 26, 2022, the disclosures of which are incorporated herein by reference in its entirety.

TECHNICAL FIELD

The present disclosure relates to the field of display technologies, in particular to a display apparatus.

BACKGROUND OF THE INVENTION

A display apparatus includes a display panel and a backlight module disposed on a non-display side of the display panel, and the backlight module is configured to provide backlight to the display panel. The backlight module includes a substrate and a plurality of light-emitting elements disposed on a surface of the base substrate.

SUMMARY OF THE INVENTION

The present disclosure provides a display apparatus, and the technical solution is as follows.

In one aspect, a display apparatus is provided. The display apparatus includes:

a display panel, wherein an orthographic projection of the display panel on a reference plane is in a curved state, and the reference plane is a common vertical plane of sections of a display surface of the display panel at a plurality of positions;

a backlight module, wherein the backlight module is disposed on one side farther away from a display side of the display panel, and is configured to provide backlight to the display panel, the backlight module includes a base substrate and a plurality of light-emitting elements arranged in an array and disposed on one side of the base substrate, and the base substrate is a flat plate structure; and wherein a difference value of backlight brightness provided by the backlight module to different regions of the display panel is smaller than a difference value threshold.

Optionally, the plurality of light-emitting elements are arranged at unequal intervals in a first direction, and the first direction is parallel to the reference plane and the base substrate.

Optionally, a surface of the base substrate facing the display panel has two opposite and parallel first edges and two opposite and parallel second edges, the two first edges extend in the first direction, the two second edges extend in a second direction, the second direction is perpendicular to the first direction, the base substrate also has an axis, and the axis is parallel to the second direction and bisects any of the two first edges; and a distance in the first direction between two light-emitting elements closer to the axis and arranged in the first direction in the plurality of light-emitting elements is greater than a distance in the first direction between two light-emitting elements farther away from the axis and arranged in the first direction in the plurality of light-emitting elements.

Optionally, the backlight module has a plurality of light regions, each light region has at least two light-emitting elements therein, and the plurality of light regions are arranged in an array in the first direction and the second direction; and wherein the plurality of light regions are axially symmetrically distributed on the base substrate with the axis as a symmetry axis.

Optionally, the plurality of light-emitting elements are axially symmetrically distributed on the base substrate with the axis as the symmetry axis.

Optionally, the backlight module has a plurality of signal channels arranged in the first direction, each signal channel extends in the second direction, each signal channel includes a plurality of light regions, each light region has at least two light-emitting elements therein, and the plurality of light regions are arranged in an array in the first direction and the second direction; the display apparatus further includes: a driving circuit, the driving circuit is connected with the backlight module and configured to provide configuration information to the plurality of light regions of each signal channel of the backlight module, and a size of the configuration information of each light region is positively related to a maximum brightness to be achieved by the light region; and wherein sizes of configuration information provided by the driving circuit to a plurality of light regions of at least two signal channels in the plurality of signal channels arranged in the first direction are different, the first direction is parallel to the reference plane and the base substrate, and the second direction is perpendicular to the first direction.

Optionally, a surface of the base substrate facing the display panel has two opposite and parallel first edges and two opposite and parallel second edges, the two first edges extend in the first direction, the two second edges extend in the second direction, the base substrate also has the axis, and the axis is parallel to the second direction and bisects any of the two first edges; and a size of configuration information provided by the driving circuit to the light regions of a signal channel closer to the axis in the plurality of signal channels is less than a size of configuration information provided by the driving circuit to a light region of the signal channel farther away from the axis in the plurality of signal channels.

Optionally, sizes of the configuration information provided by the driving circuit to the plurality of light regions disposed in the same signal channel are the same.

Optionally, the display apparatus further includes a plurality of driving sub-circuits, and each driving sub-circuit is connected with light-emitting elements in at least one light region; and wherein for each driving sub-circuit, the driving sub-circuit is configured to receive configuration information provided by the driving sub-circuit, and control brightness of the light-emitting elements in the light region connected to the driving sub-circuit after processing the configuration information.

Optionally, the backlight module has a plurality of signal channels arranged in the first direction, each signal channel extends in the second direction, each signal channel includes a plurality of light regions, each light region has at least two light-emitting elements therein, and the plurality of light regions are arranged in an array in the first direction and the second direction; the display apparatus further includes: a driving circuit, the driving circuit is connected with the backlight module and configured to provide configuration information to the plurality of light regions of each signal channel of the backlight module, and the size of the configuration information configured for each light region is positively related to the maximum brightness to be achieved by the light region; and wherein sizes of configuration information provided by the driving circuit to at least two light regions in the plurality of light regions arranged in the first direction are different, the plurality of light-emitting elements are arranged at unequal intervals in the first direction, the first direction is parallel to the reference plane and the base substrate, and the second direction is perpendicular to the first direction.

Optionally, a distance in the second direction between any two adjacent light-emitting elements arranged in the second direction in the plurality of light-emitting elements is the same.

Optionally, the display apparatus further includes: a plurality of support columns disposed between the backlight module and the display panel, and the plurality of support columns are configured to support the display panel.

Optionally, the plurality of support columns arranged in the first direction in the plurality of support columns are arranged at unequal intervals, and have different lengths in a direction perpendicular to a bearing surface of the base substrate.

Optionally, a distance in the first direction between two support columns closer to an axis of the base substrate in the plurality of support columns is greater than a distance in the first direction between two support columns farther away from the axis in the plurality of support columns; and a length of a support column closer to the axis in the plurality of support columns in a direction perpendicular to the base substrate is less than a length of a support column farther away from the axis in the plurality of support columns in the direction perpendicular to the base substrate.

Optionally, the display apparatus further includes an optical module; and the optical module is disposed between the display panel and the backlight module and is configured to adjust the backlight provided by the backlight module to the display panel.

BRIEF DESCRIPTION OF DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

For clearer descriptions of the objectives, technical solutions, and advantages of the present disclosure, the present disclosure is further described in detail hereinafter in combination with the accompanying drawings.

In related art, with the requirements of market for curved surface products, a backlight module is bonded to a back plate with curvature to form a curved surface backlight module to match a curved surface display apparatus and thus a curved surface display is acquired.

In this way, in order to prevent the backlight module from being subjected to a bending internal stress and resulting in reduction of a product yield, the bending resistance of a substrate of the backlight module is required to be higher.

In the related art, the backlight module includes the substrate and mini light-emitting diodes (Mini LEDs) arranged on the substrate in an array, and the substrate may be made of glass with a thickness of 0.7 mm. In the curved surface display, the glass provided with the mini LEDs is bonded to the back plate with curvature to realize the curved surface backlight module. When the glass is in a curved state, various film layers (such as a circuit layer) on the glass will be subjected to an extrusion internal stress. In an aging process, there will be a problem of decrease in an adhesive force of the film layers, and since the glass is bonded to the back plate, there is a great risk of glass breakage.

Figure 1:
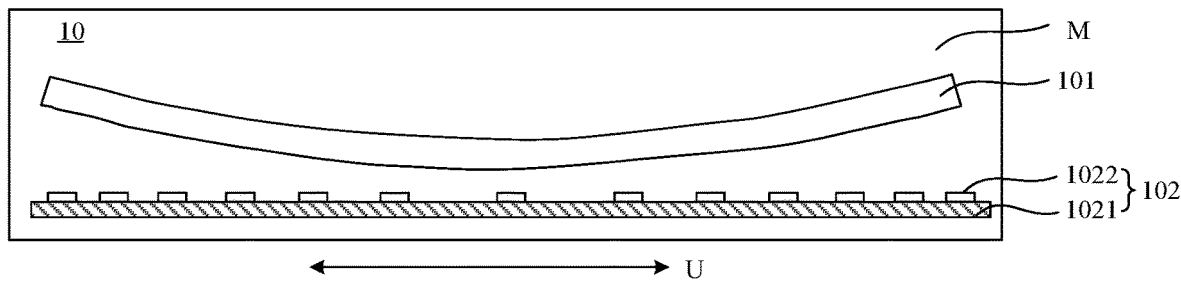
FIG. 1 is a structural schematic diagram of a display apparatus according to an embodiment of the present disclosure.

The embodiment of the present disclosure provides a display apparatus, in particular to a curved surface display apparatus. Referring to FIG. 1, the display apparatus 10 may include: a display panel 101 and a backlight module 102. The backlight module 102 is disposed on one side farther away from a display side of the display panel 101, that is, the backlight module 102 is disposed on a non-display side of the display panel 101. The backlight module 102 is configured to provide backlight to the display panel 101.

Referring to FIG. 1, the backlight module 102 includes a base substrate 1021 and a plurality of light-emitting elements 1022 arranged in an array and disposed on one side of the base substrate 1021. The base substrate 1021 has a flat plate structure, and the display panel 101 has a curved structure. That the display panel 101 has a curved structure may mean that an orthographic projection of the display panel 101 on a reference plane M is in a curved state. Specifically, an orthographic projection of a surface of the display panel 101 closer to the backlight module 102 on the reference plane M is a curve. The reference plane M is a common vertical plane of tangent planes of a display surface of the display panel 101 at a plurality of positions, that is, the reference plane M is perpendicular to the tangent plane of the display surface of the display panel at any position. For example, the reference plane M is shown in FIG. 1, the orthographic projection of the display panel 101 on the reference plane M is in a curved state, and the orthographic projection of the base substrate 1021 on the reference plane M is in a straight state. The light-emitting element 1022 may be an inorganic LED.

In the embodiment of the present disclosure, the base substrate 1021 in the backlight module 102 is a flat plate structure (that is, the base substrate 1021 is not curved). Therefore, the structure in the backlight module 102 can be prevented from being subjected to the bending internal stress, thereby avoiding a damage to the backlight module 102 and ensuring a yield of the display apparatus 10.

Moreover, the difference value of backlight brightness which can be provided by the backlight module 102 to different regions of the display panel 101 is smaller than a difference value threshold. The difference value threshold may be a pre-designed fixed threshold. The fact that backlight brightness provided by the backlight module 102 to different regions of the display panel 101 may refer to the maximum backlight brightness which can be provided by the backlight module 102 to different regions of the display panel 101. Due to the small difference in the backlight brightness provided by the backlight module 102 to different regions of the display panel 101, the display apparatus 10 is better in brightness uniformity.

In summary, the base substrate in the backlight module of the display apparatus according to the embodiment of the present disclosure is a flat plate structure, which can prevent the structure in the backlight module from being subjected to the bending internal stress, thereby avoiding a damage to the backlight module and ensuring a yield of the display apparatus. At the same time, the difference of the backlight brightness provided by the backlight module to different regions of the display panel is smaller, so that the brightness uniformity of different regions of the display apparatus can be ensured, and a display effect of the display apparatus is better.

Figure 2:
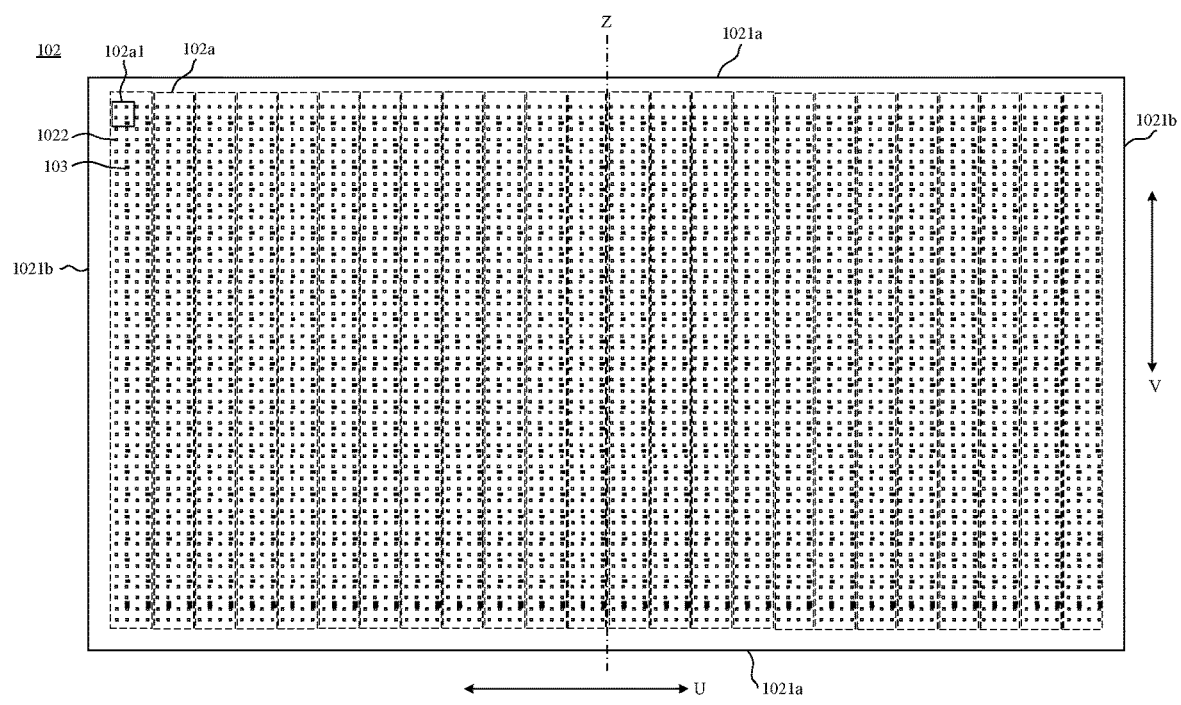
FIG. 2 is a top view of a backlight module according to an embodiment of the present disclosure.
Figure 3:
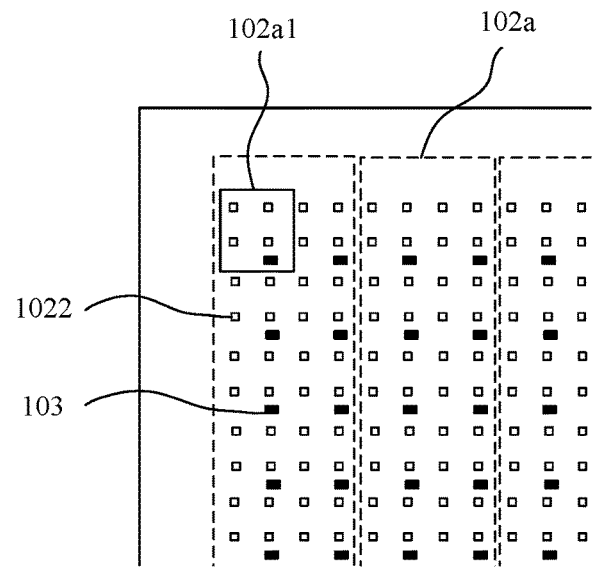
FIG. 3 is a partial schematic diagram of the backlight module shown in FIG. 2.

Optionally, referring to FIG. 2, the backlight module 102 may have a plurality of signal channels 102a arranged in a first direction U, and each signal channel 102a extends in a second direction V. Each signal channel 102a includes a plurality of light regions 102a1 arranged at least in the second direction V, and each light region 102a1 has at least two light-emitting elements 1022 therein. The plurality of light regions 102a1 are arranged in an array in the first direction U and the second direction V. For example, in FIG. 2, the backlight module 102 has 24 signal channels 102a and 1152 light regions 102a1. FIG. 3 is a partial schematic structural diagram of the backlight module shown in FIG. 2. Referring to FIG. 3, each light region 102a1 has 2*2 light-emitting elements 1022.

In the embodiment of the present disclosure, the difference value of the backlight brightness which can be provided by the backlight module 102 to different regions of the display panel 101 is less than the difference value threshold, which may be expressed in two ways.

Firstly, each ratio of the backlight brightness provided by the backlight module 102 to different regions of the display panel 101 to reference brightness is greater than a brightness threshold. The reference brightness may refer to standard brightness of each region of the display apparatus, in a case that the flat backlight module (in which the base substrate is not curved) provides the backlight to the flat display panel (which is a non-curved display panel). The brightness threshold may be determined based on regular specifications of desktop Monitor (MNT) products, for example, the brightness threshold may be 80%.

The fact that each ratio of the backlight brightness provided by the backlight module 102 to different regions of the display panel 101 to the reference brightness is greater than the brightness threshold may mean that the ratio of the maximum backlight brightness which can be provided by different signal channels 102a in the backlight module 102 to the reference brightness is greater than the brightness threshold, that is, the following is satisfied:

$$\frac{L_1}{L_0} \geq 80\% \ \& \ ... \ \& \frac{L_i}{L_0} \geq 80\% \ \& \ ... \ \& \frac{L_I}{L_0} \geq 80\% \qquad \text{Formula (1)}$$

Secondly, for each signal channel 102a in the backlight module 102, the ratio of the backlight brightness provided by the signal channel 102a to the display panel 101 to the reference brightness is greater than the brightness threshold, and the ratio of the backlight brightness provided by this signal channel 102a to the display panel 101 to the backlight brightness provided by any another signal channel 102a in the backlight module 102 to the display panel 101 is greater than the brightness threshold, that is, the following is satisfied:

$$\frac{L_i}{L_0} \geq 80\% \ \& \ ... \ \& \frac{L_i}{L_{i-1}} \geq 80\% \ \& \ ... \ \& \frac{L_i}{L_I} \geq 80\% \qquad \text{Formula (2)}$$

It should be noted that the brightness uniformity of the display apparatus 10 can meet the requirement by satisfying at least one of the above Formula (1) and Formula (2). In the above Formula (1) and Formula (2), $L_0$ is the reference brightness, $L_1$ is the average value of the unit length of the backlight brightness provided by a first signal channel to the display panel 101 in the first direction U, $L_i$ is the average value of the unit length of the backlight brightness provided by an it signal channel to the display panel 101 in the first direction U, $L_{i+1}$ is the average value of the unit length of the backlight brightness provided by an $(i-1)^{th}$ signal channel to the display panel 101 in the first direction U, and Ly is the average value of the unit length of the backlight brightness provided by an $I^{th}$ signal channel to the display panel 101 in the first direction U. I is the total number of signal channels, I is a positive integer greater than 0, i and i−1 are both positive integers greater than 0 and less than or equal to I, and & is configured to indicate "and".

In the embodiment of the present disclosure, the backlight module 102 may further include a circuit layer and a reflective layer which are disposed on the base substrate 1021. The circuit layer may include at least one wiring layer and a passivation layer (PVX) for protecting the wiring layer. The wiring layer may be a copper (Cu) layer. The reflective layer may be white oil or a reflective sheet. A preparation process for the backlight module 102 may include: forming the circuit layer on one side of the base substrate 1021; and forming the reflective layer on one side of the circuit layer farther away from the base substrate 1021. The reflective layer includes a plurality of openings and each opening corresponds to one light-emitting element 1022. The backlight module 102 further includes protective adhesive 1023 covering each light-emitting element 1022.

Since the base substrate 1021 of the backlight module 102 in the embodiment of the present disclosure is a flat plate structure, even if the base substrate 1021 is a glass substrate, the circuit layer and the reflective layer on the base substrate 1021 will not be subjected to a bending internal stress, and an adhesive force of the film layers can be ensured. In addition, an assembling process of the backlight module 102 is simpler, and the breakage risk of the base substrate 1021 is lower.

In the embodiment of the present disclosure, referring to FIG. 2, the surface of the base substrate 1021 facing the display panel 101 has two opposite and parallel first edges 1021a and two opposite and parallel second edges 1021b. The two first edges 1021a extend in the first direction U, and the two second edges 1021b extend in the second direction V. The first direction U is parallel to the reference plane M and the base substrate 1021, and the second direction V is perpendicular to the first direction U. The base substrate 1021 also has an axis Z, and the axis Z may be parallel to the second direction V and bisect any first edge 1021a.

Since the base substrate 1021 of the backlight module 102 is a flat plate structure and the orthographic projection of the display panel 101 on the reference plane M is in a curved state, the closer to a position of the axis Z, the smaller the distance between the light-emitting element 1022 and the display panel 101 in the backlight module 102; and the farther away from the position of the axis Z, the larger the distance between the light-emitting element 1022 and the display panel 101 in the backlight module 102.

Figure 5:
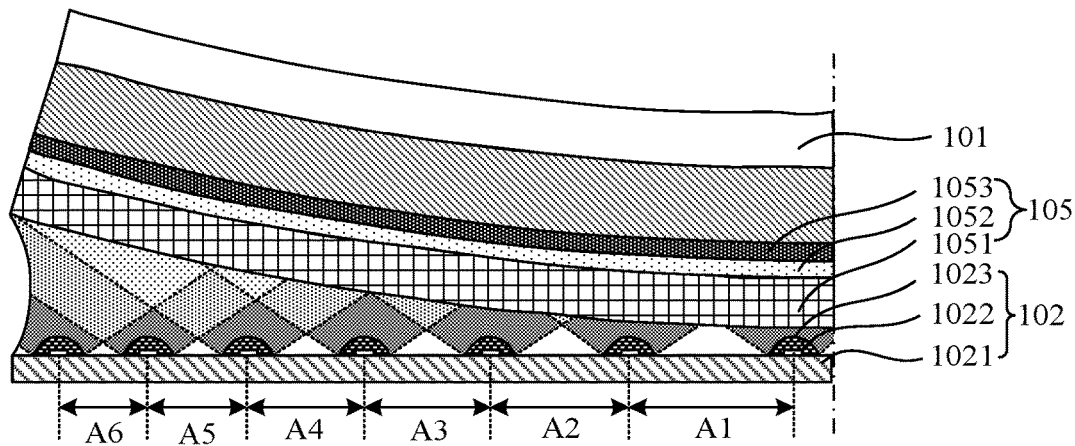
FIG. 5 is a partial schematic diagram of a display apparatus according to an embodiment of the present disclosure.

Referring to FIG. 5, on the premise that the light-emitting angle of each light-emitting element 1022 in the backlight module 102 is the same, the greater the distance between the light-emitting element 1022 and the display panel 101, the greater the light loss emitted by the light-emitting element 1022, that is, the smaller the light intensity incident onto the corresponding region of the display panel 101. Since the display panel 101 is in a curved state, the distances between different regions of the display panel 101 and the light-emitting elements 1022 of the backlight module 102 are different, thereby leading to poor uniformity of the backlight brightness provided by the backlight module 102 to the display panel 101.

It should be noted that an orthographic projection of the curved display panel 101 on a plane where the base substrate 1021 is disposed falls into the base substrate 1021, and the area of the orthographic projection of the display panel 101 on the plane where the base substrate 1021 is disposed is basically equal to the area of a surface of the base substrate 1021 which is provided with the light-emitting elements 1022. For any signal channel 102a of the backlight module 102, the light region 102a1 of the signal channel 102a is configured to provide backlight to a specific region of the display panel 101, and an orthographic projection of the specific region on the plane where the base substrate 1021 is disposed falls into the region where the signal channel 102a is disposed.

Since the backlight brightness $L_i$ provided by the backlight module 102 to the display panel 101 is positively related to a distance $Y_i$ between the base substrate 1021 and the display panel 101 (the distance between the base substrate 1021 and the display panel 101 is equal to the sum of a distance between the light-emitting element 1022 and the display panel 1021 and a length of the light-emitting elements 1022 in the direction perpendicular to the base substrate 1021), the backlight brightness provided by the backlight module 102 to the display panel 101 may be expressed by a function with the distance between the base substrate 1021 and the display panel 101 as an independent variable, that is, the following is satisfied:

$$L_i = f(Y_i) \qquad \text{Formula (3)}$$

In the above Formula (3), $L_i$ is the backlight brightness of the $i^{th}$ signal channel 102a in the direction farther away from the axis Z from the position of the axis Z, and $Y_i$ is the distance between the base substrate 1021 corresponding to a region and the display panel 101, where any light-emitting element 1022 in the $i^{th}$ signal channel 102a in the direction farther away from the axis Z from the position of the axis Z is disposed in the region.

Figure 6:
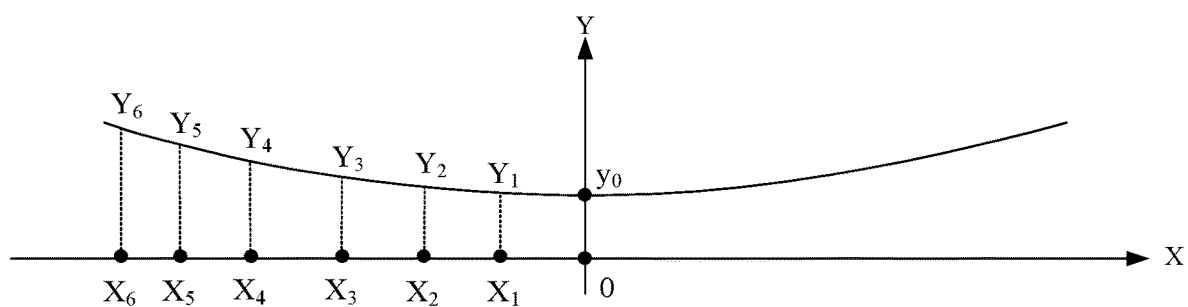
FIG. 6 is a schematic curve diagram of a display panel on a reference plane according to an embodiment of the present disclosure.

The orthographic projection of the surface in the display panel 101 closer to the backlight module 102 on the reference plane M is curved. FIG. 6 shows an embodiment according to the present disclosure, and the curve is an inferior arc. The curve satisfies the equation:

$$X_j^2 + (Y_j - R - y_0)^2 = R^2 \qquad \text{Formula (4)}$$

In the above Formula (4), $X_j$ is the distance in the first direction U between a $j^{th}$ light-emitting element 1022 in the direction farther away from the axis Z from the position of the axis Z and the axis Z. $Y_j$ is the distance between the base substrate 1021 corresponding to a region and the display panel 101, where the $j^{th}$ light-emitting element 1022 in the direction farther away from the axis Z from the position of the axis Z is disposed in the region. R is a curvature radius, and $y_0$ is the distance between a part of the base substrate 1021 at the position of the axis Z and the display panel 101, that is, the minimum distance between the base substrate 1021 and the display panel 101. The value range of $X_j$ is positively related to the length of the base substrate 1021 in the first direction U and the curvature radius of the display panel 101, and j is a positive integer greater than 0 and less than or equal to half of the number of the plurality of light-emitting elements 1022 in the first direction.

In the embodiment of the present disclosure, a value of the curvature radius is within a specific range, for example, the curvature radius may range from 700 mm to 2000 mm, and $y_0$ may be determined based on the type of the light-emitting element 1022, the light-emitting angle of the light-emitting element 1022, the size of the light-emitting element 1022, the height of the protective adhesive on one side of the light-emitting element 1022 closer to the base substrate 1021, and the type and thickness of each film material in an optical module 105. The distance $X_1$ between the first light-emitting element 1022 in the direction farther away from the axis Z from the position of the axis Z and the axis Z in the first direction U may be determined based on required specification brightness, the thickness of the display apparatus 10, the type of each film material in the optical module 105 and the type of the light-emitting element 1022. The distance $X_j$ between other light-emitting elements 1022 and the axis Z in the first direction U other than $X_1$ may be calculated by the above Formula (4) after determining $y_0$ and R.

Figure 4:
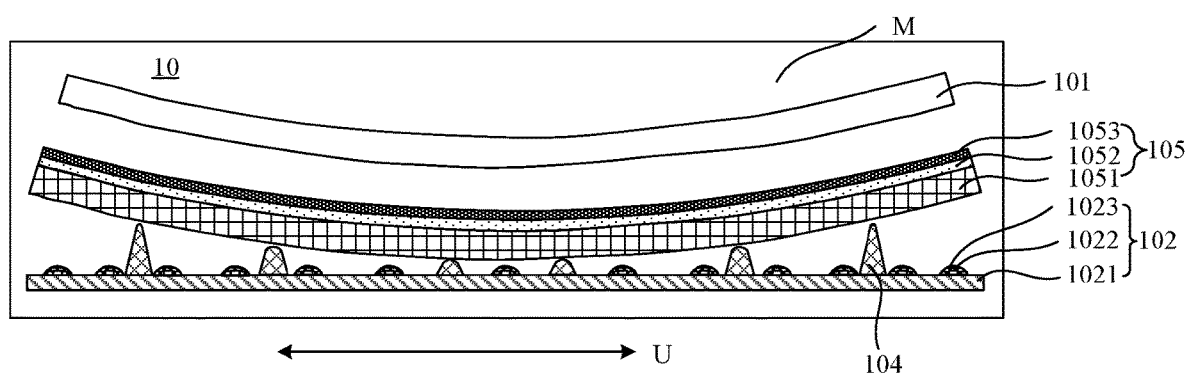
FIG. 4 is a structural schematic diagram of another display apparatus according to an embodiment of the present disclosure.

By taking the case that a diagonal of the base substrate 1021 is 34 inches as an example, if the display apparatus 10 is expected to realize HDR 1000 in a case that a light transmittance of the display panel 101 is 2.9% and the backlight module 102 has 1000 light regions, according to optical requirements, a blue light-emitting diode with a length of 16 mils and a width of 9 mils is selected as the light-emitting element 1022. Referring to FIG. 4, the backlight module 102 further includes an optical module 105 disposed between the base substrate 1021 and the display panel 101. Optionally, the optical module 105 includes a diffusion film 1051 with a thickness of 3 mm, a color conversion film 1052 with a thickness of 0.3 mm and a composite film 1053 with a thickness of 0.45 mm which are stacked. The color of light emitted by the light-emitting element 1022 can be changed after passing through the color conversion film 1052, for example, the blue light-emitting diode can emit white light after light passes through the color conversion film 1052; the composite film 1053 may be composed of a dual brightness enhancement film (DBEF) and two prism films. The DBEF is a reflective polarizer and plays a role in brightness enhancement. Therefore, according to the brightness requirement of HDR 1000 and the transmittance of the display panel 101, it is calculated that the reference brightness (maximum brightness) provided by backlight module 102 needs to reach 14000 nits. Further, the backlight module 102 has 1000 light regions 102a1, which needs the minimum distance between the base substrate 1021 and the display panel 101 to be at least 5 mm, that is, the distance between the part of the base substrate 1021 at the axis Z and the display panel 101 is 5 mm, and the distance between the first light-emitting element 1022 in the direction farther away from the axis Z from the position of the axis Z and the axis Z in the first direction U is 8.371 mm. That is, $X_1$=8.371 mm, $y_0$=5 mm and $L_0$=14000 nits.

HDR 1000 is an authentication standard for the display, and it means that this display supports high-dynamic range (HDR) images and can reach the peak brightness of 1000 nits. For example, HDR 1000 has a typical (Typ) brightness of 750 nits and a peak brightness of 1250 nits.

It can be seen from the above Formula (3) that $L_i$ is related to $Y_i$, while it can be seen from the above Formula (4) that $L_i$ is related to $Y_j$ and $X_j$. In addition, both $Y_i$ and $Y_j$ are configured to represent the distance between the base substrate 1021 of the region where the light-emitting element 1022 is disposed and the display panel 101. Therefore, by combining Formula (3) and Formula (4), it can be known that $L_i$ is related to $X_j$, that is, $L_i$ may be a function with $X_j$ as an independent variable, that is, the following is satisfied:

$$L_i = f(X_j) \quad \text{Formula (5)}$$

According to the above Formula (5), it can be known that in order to ensure the uniformity of the backlight brightness provided by the backlight module 102 to different regions of the display panel 101 (for example, the ratio of the brightness of each region to the reference brightness is greater than 80%), it can be realized by adjusting arrangement of the light-emitting elements 1022 in the backlight module 102. Specifically, the distance in the first direction U between the light-emitting elements 1022 arranged in the first direction U and the axis Z may be adjusted.

As an alternative implementation, the plurality of light-emitting elements 1022 in the backlight module 102 are arranged at unequal intervals in the first direction U. That is, the distance in the first direction U between two light-emitting elements 1022, which are arranged in the first direction U, of the plurality of light-emitting elements 1022 is different from the distance in the first direction U between the other two light-emitting elements 1022, which are arranged in the first direction U, of the plurality of light-emitting elements 1022.

Exemplarily, the closer to the position of the axis Z, the smaller the distance between the base substrate 1021 and the display panel 101 in the backlight module 102, and the farther away from the position of the axis Z, the greater the distance between the base substrate 1021 and the display panel 101 in the backlight module 102. Therefore, the distance in the first direction U between two adjacent light-emitting elements 1022 of the plurality of light-emitting elements 1022 can be successively reduced in the direction farther away from the axis Z. That is, the distance in the first direction U between two light-emitting elements 1022, which are closer to the axis Z and arranged in the first direction U, of the plurality of light-emitting elements 1022 is greater than the distance in the first direction U between two light-emitting elements 1022, which are farther away from the axis Z and arranged in the first direction U, of the plurality of light-emitting elements 1022.

Referring to FIG. 5, A6<A5<A4<A3<A2<A1. A1 is the distance in the first direction U between the first light-emitting element 1022 and the second light-emitting element 1022 in the direction farther away from the axis Z from the position of the axis Z. A2 is the distance in the first direction U between the second light-emitting element 1022 and the third light-emitting element 1022 in the direction farther away from the axis Z from the position of the axis Z. A3 is the distance in the first direction U between the third light-emitting element 1022 and the fourth light-emitting element 1022 in the direction farther away from the axis Z from the position of the axis Z. A4 is the distance in the first direction U between the fourth light-emitting element 1022 and the fifth light-emitting element 1022 in the direction farther away from the axis Z from the position of the axis Z. A5 is the distance in the first direction U between the fifth light-emitting element 1022 and the sixth light-emitting element 1022 in the direction farther away from the axis Z from the position of the axis Z. A6 is the distance in the first direction U between the sixth light-emitting element 1022 and the seventh light-emitting element 1022 in the direction farther away from the axis Z from the position of the axis Z. FIG. 5 is only a schematic diagram, and does not show the actual number of the light-emitting elements 1022 in the backlight module 102.

Optionally, the plurality of light regions 102a1 may be axially symmetrically distributed on the base substrate 1021 with the axis Z as a symmetry axis. In the plurality of light regions 102a1, there may be a column of light regions 102a1, which are arranged in the second direction V, and are disposed on the axis Z of the base substrate 1021. If there are an odd number of light-emitting elements 1022 in the first direction U in each light region 102a1, a column of light-emitting elements 1022 arranged in the second direction V in a column of light regions 102a1 disposed on the axis Z of the base substrate 1021 may be disposed on the axis Z. If there are an even number of light-emitting elements 1022 in the first direction U in each light region 102a1, a column of light regions 102a1 disposed on the axis Z of the base substrate 1021 coincide with the axis Z of the base substrate 1021 along a middle line of the second direction V.

Alternatively, the plurality of light-emitting elements 1022 of the backlight module 102 may be axially symmetrically distributed on the base substrate 1021 with the axis Z as a symmetry axis. If there are an odd number of light-emitting elements 1022 in the first direction U in the backlight module 102, there may be a column of light-emitting elements 1022, which are arranged in the second direction V and are disposed on the axis Z. If there are an even number of light-emitting elements 1022 in the first direction U in the backlight module 102, there are no column of light-emitting elements 1022, which are arranged in the second direction V and are disposed on the axis Z.

In the embodiment of the present disclosure, the display apparatus 10 further includes: a driving circuit (not shown in the figure). The driving circuit may be connected with the backlight module 102 for providing configuration information to the light regions 102a1 of each signal channel 102a of the backlight module 102. The size of the configuration information of each light region 102a1 may be positively related to the maximum brightness to be achieved by the light region 102a1. The configuration information may be a configuration current, and the size of the configuration information may refer to a magnitude of the configuration current. The maximum brightness to be achieved by the light region 102a1 is determined on the premise that the brightness uniformity of the display apparatus is ensured when the display apparatus 10 displays a white picture.

As another optional implementation, if the plurality of light-emitting elements 1022 in the backlight module 102 are arranged at equal intervals in the first direction U, the uniformity of backlight brightness provided by the backlight module 102 to the display panel 101 will be poor. Therefore, in this case, referring to FIG. 7, the maximum brightness that can be achieved by the light region 102a1 is non-linearly and positively related with the configuration information (configuration current) of the light region 102a1. Besides, referring to FIG. 8, the configuration information of the light region 102a1 is non-linearly and positively related with a voltage provided by the driving circuit to the light region 102a1. That is, the configuration information of the light region 102a1 will affect the maximum brightness that can be achieved by the light region 102a1, and the voltage provided by the driving circuit will affect the configuration information of the light region 102a1. Therefore, the configuration information provided by the driving circuit to the light regions 102a1 in the signal channel 102a of the backlight module 102 can be adjusted by adjusting the voltage provided by the driving circuit to the light regions 102a1, and then the brightness of each light region 102a1 and even each light-emitting element 1022 can be adjusted to achieve brightness uniformity.

Figure 7:
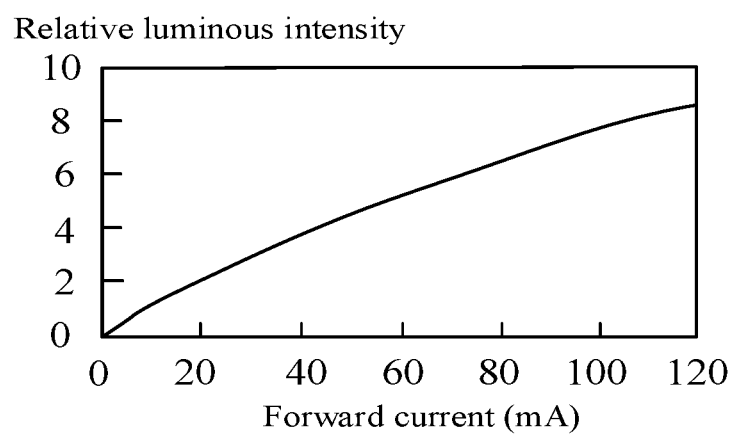
FIG. 7 is a graph showing a relationship between a maximum brightness achievable by a light region and configuration information according to an embodiment of the present disclosure.
Figure 8:
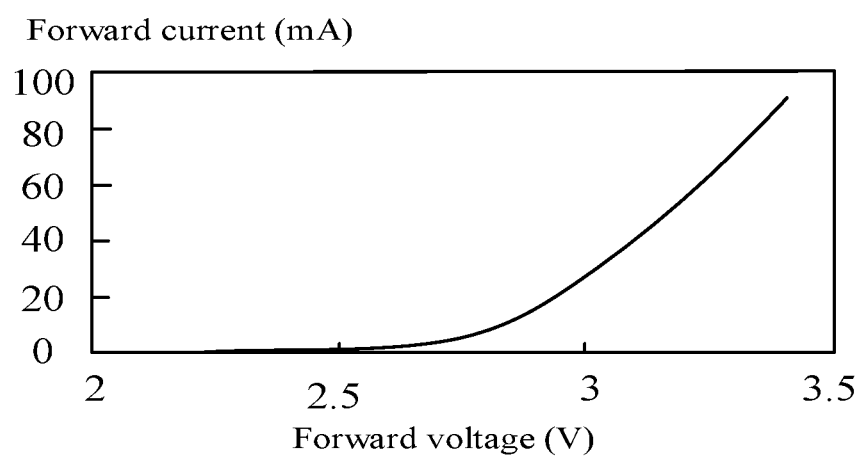
FIG. 8 is a graph showing a relationship between configuration information and a voltage provided by a driving circuit to a light region according to an embodiment of the present disclosure.

FIG. 8 is an actual test graph of the configuration information and voltage of the light-emitting element with a size of 152.04 μm×508 μm. FIG. 7 is an actual test graph of the brightness and configuration information of the light-emitting element with a size of 152.04 μm×508 μm. The configuration information of the light regions 102a1 in different signal channels 102a may be configured on the premise that the brightness uniformity is satisfied when the display apparatus 10 displays the white picture of the maximum brightness before the product leaves the factory.

Optionally, the backlight brightness $L_i$ provided by the backlight module 102 to the display panel 101 may be expressed as a function with the configuration information $I_i$ provided by the driving circuit to the light regions 102a1 in the $i^{th}$ signal channel 102a of the backlight module 102 as an independent variable, that is, the following is satisfied:

$$L_i = f(I_i) \qquad \text{Formula (6)}$$

The sizes of the configuration information provided by the driving circuit to the light regions 102a1 of at least two signal channels 102a in the plurality of signal channels 102a arranged in the first direction U are different.

Exemplarily, the size of the configuration information provided by the driving circuit to the light regions 102a1 of the signal channel 102a closer to the axis Z in the plurality of signal channels 102a is less than the size of the configuration information provided by the driving circuit to the light regions 102a1 of the signal channel 102a farther away from the axis Z in the plurality of signal channels 102a. That is, the maximum backlight brightness that can be provided by the light regions 102a1 of the signal channel 102a closer to the axis Z in the plurality of signal channels 102a to the display panel 101 is less than the maximum backlight brightness that can be provided by the light regions 102a1 of the signal channel 102a farther away from the axis Z in the plurality of signal channels 102a to the display panel 101.

In the embodiment of the present disclosure, the size of the configuration information provided by the driving circuit to the plurality of light regions 102a1 disposed in the same signal channel 102a is the same. That is, the maximum backlight brightness that can be achieved by the plurality of light regions 102a1 in the same signal channel 102a may be the same.

Optionally, referring to FIG. 2 and FIG. 3, the display apparatus 10 further includes a plurality of driving sub-circuits 103. Each driving sub-circuit 103 may be connected to the light-emitting elements 1022 in at least one light region 102a1. For each driving sub-circuit 103, the driving sub-circuit 103 is configured to receive the configuration information provided by the driving circuit, and control brightness of the light-emitting elements 1022 in the light region 102a1 connected to the driving sub-circuit 103 after processing the configuration information.

It can be understood that the configuration information of the light regions 102a1 of the same signal channel 102a is the same. In addition, in an actual use process of the product, the emergent light brightness of different light regions 102a1 of the same signal channel 102a may be the same or different. This is related to picture information to be displayed by the display apparatus 10.

In the embodiment of the present disclosure, the number of the driving sub-circuits 103 included in the display apparatus 10 may be the same as the number of the light regions 102a1 included in the backlight module 102, and the driving sub-circuits and the light regions are in one-to-one correspondence. Each driving sub-circuit 103 is connected with the light-emitting elements 1022 in one corresponding light region 102a1, and is configured to control the brightness of the light-emitting elements 1022 in the light region 102a1 based on the configuration information received from the driving circuit.

For each signal channel 102a, the plurality of driving sub-circuits 103 corresponding to the plurality of light regions 102a1 of the signal channel 102a are cascaded.

Optionally, each signal channel 102a includes two columns of light regions 102a1 arranged in the first direction U and extending in the second direction V. For each signal channel 102a, the plurality of driving sub-circuits 103 corresponding to the plurality of light regions 102a1 of the signal channel 102a are sequentially cascaded in a U shape or in an inverted U shape. For example, in the same signal channel 102a, starting from the driving sub-circuit 103 corresponding to one light region 102a1 closest to the bottom, cascading is sequentially performed to the driving sub-circuit 103 corresponding to the light region 102a1 at the top in the second direction V, then the driving sub-circuit 103 corresponding to the light region 102a1 at the top of an adjacent column is turned to and connected, and finally the cascading is sequentially performed to the driving sub-circuit 103 corresponding to the light region 102a1 at the bottom of the adjacent column in the second direction V.

As yet another optional implementation, based on Formula (5), it can be known that the backlight brightness provided by the backlight module 102 to different regions of the display panel 101 is related to the distance in the first direction U between the plurality of light-emitting elements 1022 and the axis Z. Based on Formula (6), it can be known that the backlight brightness provided by the backlight module 102 to different regions of the display panel 101 is related to the configuration information provided by the driving circuit to the light regions 102a1 in the signal channels 102a of the backlight module 102. Therefore, the distance in the first direction U between the light-emitting elements 1022 arranged in the first direction U and the axis Z and the configuration information provided by the driving circuit to the light regions 102a1 in the signal channels 102a of the backlight module 102 can be adjusted at the same time, and thus the brightness uniformity of the display apparatus is realized.

Optionally, the plurality of light-emitting elements 1022 in the backlight module 102 are arranged at unequal intervals in the first direction U, and the sizes of the configuration information provided by the driving circuit to the light regions 102a1 of at least two signal channels 102a in the plurality of signal channels 102a arranged in the first direction U are different.

Exemplarily, the distance in the first direction U between two light-emitting elements 1022 closer to the axis Z and arranged in the first direction U in the plurality of light-emitting elements 1022 is less than the distance in the first direction U between two light-emitting elements 1022 farther away from the axis Z and arranged in the first direction U in the plurality of light-emitting elements 1022. Moreover, the size of the configuration information provided by the driving circuit to the light regions 102a1 of the signal channel 102a closer to the axis Z in the plurality of signal channels 102a is less than the size of the configuration information provided by the driving circuit to the light regions 102a1 of the signal channel 102a farther away from the axis Z in the plurality of signal channels 102a.

In the embodiment of the present disclosure, since a cross section of the display panel 101 in the second direction V is a straight line, in order to ensure the brightness uniformity of the display apparatus 10 in the second direction V, the plurality of light-emitting elements 1022 may be arranged at equal intervals in the second direction V. That is, the distance in the second direction V between any two adjacent light-emitting elements 1022 arranged in the second direction V in the plurality of light-emitting elements 1022 is the same.

The distance between any two adjacent light-emitting elements 1022 in the second direction V may be determined synchronously when the distance $X_1$ in the first direction U between the first light-emitting element 1022 in the direction farther away from the axis Z from the position of the axis Z and the axis Z is determined. For example, the determined distance in the second direction V between any two adjacent light-emitting elements 1022 may be 7.052 mm.

Referring to FIG. 4, it can be seen that the display apparatus 10 further includes a plurality of support columns 104 disposed between the backlight module 102 and the display panel 101. The plurality of support columns 104 may be configured to support the display panel 101. Optionally, the plurality of support columns 104 arranged in the first direction U in the plurality of support columns 104 are arranged at unequal intervals, and have different lengths in the direction perpendicular to a bearing surface of the base substrate 1021.

Exemplarily, the distances in the first direction between every two adjacent support columns 104 in the plurality of support columns 104 decrease in sequence, that is, the distance in the first direction U between two adjacent support columns 104 closer to the axis Z of the base substrate 1021 in the plurality of support columns 104 is greater than the distance in the first direction U between two adjacent support columns 104 farther away from the axis Z in the plurality of support columns 104. Moreover, the lengths of the plurality of support columns 104 in the direction perpendicular to the base substrate 1021 increase in sequence, that is, the length of the support column 104 closer to the axis Z in the plurality of support columns 104 in the direction perpendicular to the base substrate 1021 is less than the length of the support column 104 farther away from the axis Z in the plurality of support columns 104 in the direction perpendicular to the base substrate 1021.

Referring to FIG. 4, the optical module 105 included in the display apparatus 10 may be disposed between the display panel 101 and the backlight module 102. The optical module 105 may be configured to adjust backlight provided by the backlight module 102. An orthographic projection of the optical module 105 on the reference plane M is in a curved state. A curvature of the optical module 105 may be the same as a curvature of the display panel 101.

Optionally, the diffusion film 1051 in the optical module 105 is configured to diffuse and homogenize the light emitted by the backlight module 102. The color conversion film 1052 in the optical module 105 is configured to convert the light emitted by the backlight module 102 from blue to white. The composite film 1053 in the optical module 105 is configured to improve the brightness of the light emitted by the backlight module 102.

It should be noted that when the display apparatus 10 includes the optical module 105, the curve shown in FIG. 6 may be a schematic curve diagram of the surface of the optical module 105 closer to the backlight module 102 on the reference plane. The distance between the light-emitting elements 1022 in the backlight module 102 and the optical module 105 may be called a mixed light distance. The greater the mixed light distance of the position in the display apparatus, the greater the distance between the corresponding light-emitting element 1022 at this position and the display panel 101. The smaller the mixed light distance of the position in the display apparatus, the smaller the distance between the corresponding light-emitting element 1022 at this position and the display panel 101.

Figure 9:
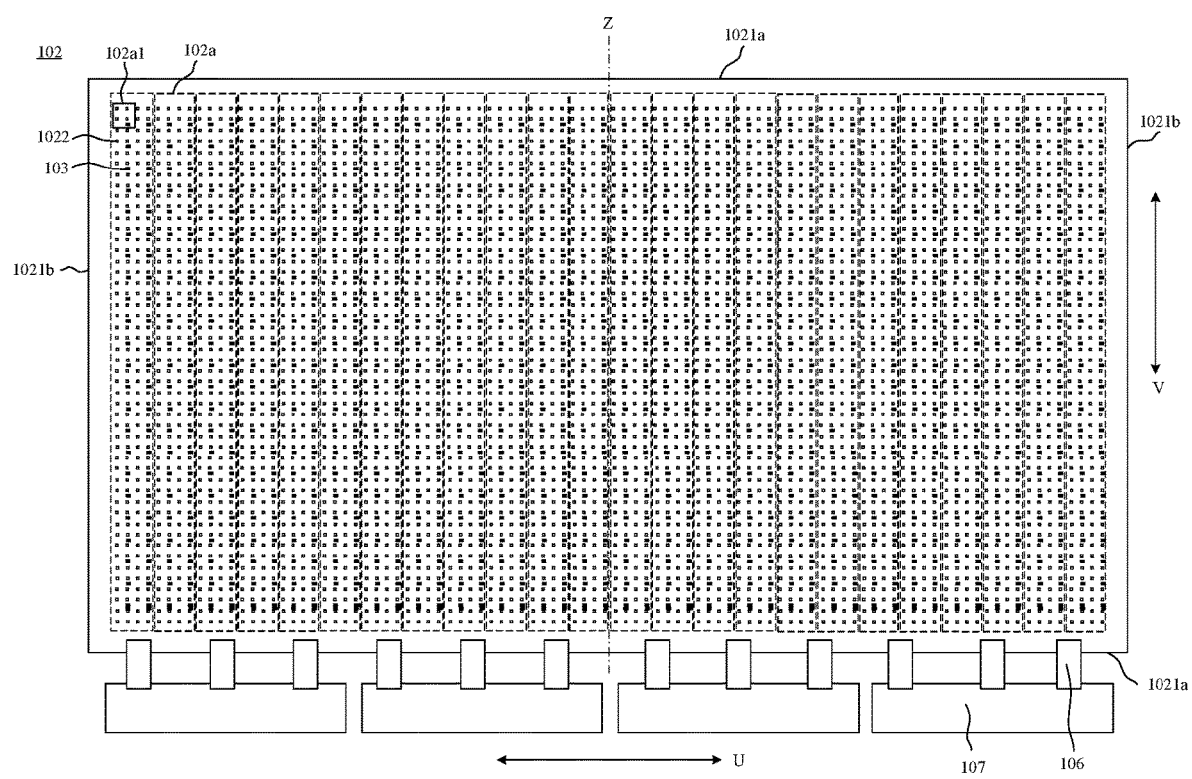
FIG. 9 is a schematic diagram of a backlight module, a flexible printed circuit board and a printed circuit board according to an embodiment of the present disclosure.

Referring to FIG. 9, the display apparatus 10 may further include a plurality of flexible circuit boards 106 and a plurality of printed circuit boards 107. Certain ends of the flexible circuit boards 106 are connected to the backlight module 102, and the other ends of the flexible circuit boards 106 are connected to the printed circuit boards 107. For example, 12 flexible circuit boards 106 and 4 printed circuit boards are shown in FIG. 9. The driving circuit in the display apparatus 10 may be disposed on the printed circuit boards 107. Moreover, the display apparatus also includes a plurality of connection wires, one end of each connection wire is connected with the driving circuit, and the other end of each connection wire is connected with the driving sub-circuits 103 connected with the light regions 102a1 in one signal channel 102a. Therefore, the configuration information provided by the driving circuit can be transmitted to the driving sub-circuits 103 through the connection wires.

Moreover, the flexible circuit boards 106 can be curved, so that the printed circuit boards 107 can be disposed on the surface of the base substrate 1021 farther away from the display panel 101 by the flexible circuit boards 106. Therefore, the size of a frame of the display apparatus 10 is reduced, and a screen-to-body ratio of the display apparatus 10 is improved.

In addition, the display apparatus 10 may also include a housing. The housing is configured to cover one side of the backlight module 102 farther away from the display panel 10, and an orthographic projection of the housing on the reference plane M is in a curved state, thereby making the display apparatus 10 a curved surface display apparatus. A curvature of the housing may be the same as the curvature of the display panel 101.

In summary, the base substrate in the backlight module of the display apparatus according to the embodiments of the present disclosure is a flat plate structure, which can prevent the backlight module from being subjected to a bending internal stress, thereby avoiding a damage to the backlight module and ensuring a yield of the display apparatus. At the same time, the difference of the backlight brightness provided by the backlight module to different regions of the display panel is smaller, so that the brightness uniformity of different regions of the display apparatus can be ensured, and the display effect of the display apparatus is better.

Moreover, since the thickness of the display apparatus decreases with the increase of the curvature radius of the display panel, in order to prevent the thickness of the display apparatus from being too large, the display panel with a larger curvature radius (smaller curvatures) can be selected. In the embodiment of the present disclosure, as long as the size of the display panel can meet the curving requirements, the corresponding backlight module including a glass substrate can be selected, and then the curved surface display apparatus can be acquired. Besides, since the glass substrate in the backlight module is not curved, other film layers in the backlight module will not be subjected to the bending internal stress, thereby ensuring the yield of the display apparatus.

In the embodiment of the present disclosure, the display apparatus may be any product or component with a display function, such as a mobile phone, a tablet computer, a television, a display, a notebook computer, a digital photo frame or a navigator.

The terms used in the embodiment section of the present disclosure are merely configured to explain the embodiments of the present disclosure, and are not intended to limit the present disclosure. Unless otherwise defined, the technical terms or scientific terms used in the embodiments of the present disclosure shall have their ordinary meanings as understood by those ordinary skilled in the art to which the present disclosure belongs. Similar words such as "first" and "second" used in the description of the patent disclosure and claims of the present disclosure do not indicate any order, quantity or importance, but are only configured to distinguish different components. Similarly, similar words such as "one" or "a" do not mean quantity limitation, but mean that there is at least one. Similar words such as "includes" or "contains" mean that the elements or objects before "includes" or "contains" cover the elements or objects and their equivalents listed after "includes" or "contains", without excluding other elements or objects. Similar words such as "connected" or "connected to each other" are not limited to physical or mechanical connection, but may include electrical connection, whether direct or indirect. "Upper", "lower", "left" and "right" are only configured to indicate a relative positional relationship. When the absolute position of the described object changes, the relative positional relationship may also change accordingly.

Described above are merely optional embodiments of the present disclosure, and are not intended to limit the present disclosure. Within the spirit and principles of the disclosure, any modifications, equivalent substitutions, improvements, and the like are contained within the protection scope of the present disclosure.

The invention claimed is:

1. A display apparatus, comprising:
   a display panel, wherein an orthographic projection of the display panel on a reference plane is in a curved state, and the reference plane is a common vertical plane of sections of a display surface of the display panel at a plurality of positions;
   a backlight module, wherein the backlight module is disposed on one side farther away from a display side of the display panel and is configured to provide backlight to the display panel, the backlight module comprises a base substrate and a plurality of light-emitting elements arranged in an array and disposed on one side of the base substrate, and the base substrate is a flat plate structure; and
   wherein a difference value of backlight brightness provided by the backlight module to different regions of the display panel is smaller than a difference value threshold.

2. The display apparatus according to claim 1, wherein the plurality of light-emitting elements are arranged at unequal intervals in a first direction, and the first direction is parallel to the reference plane and the base substrate.

3. The display apparatus according to claim 2, wherein a surface of the base substrate facing the display panel has two opposite and parallel first edges and two opposite and parallel second edges, the two first edges extend in the first direction, the two second edges extend in a second direction, the second direction is perpendicular to the first direction, the base substrate also has an axis, and the axis is parallel to the second direction and bisects any of the two first edges; and
   a distance in the first direction between two light-emitting elements closer to the axis and arranged in the first direction in the plurality of light-emitting elements is greater than a distance in the first direction between two light-emitting elements farther away from the axis and arranged in the first direction in the plurality of light-emitting elements.

4. The display apparatus according to claim 3, wherein the backlight module has a plurality of light regions, each light region has at least two light-emitting elements therein, and the plurality of light regions are arranged in an array in the first direction and the second direction; and
   wherein the plurality of light regions are axially symmetrically distributed on the base substrate with the axis as a symmetry axis.

5. The display apparatus according to claim 3, wherein the plurality of light-emitting elements are axially symmetrically distributed on the base substrate with the axis as the symmetry axis.

6. The display apparatus according to claim 1, wherein the backlight module has a plurality of signal channels arranged in the first direction, each signal channel extends in the second direction, each signal channel comprises a plurality of light regions, each light region has at least two light-emitting elements therein, and the plurality of light regions are arranged in an array in the first direction and the second direction;
   the display apparatus further comprises a driving circuit, the driving circuit is connected with the backlight module and configured to provide configuration information to the plurality of light regions of each signal channel of the backlight module, and a size of the configuration information of each light region is positively related to a maximum brightness to be achieved by the light region; and wherein sizes of configuration information provided by the driving circuit to a plurality of light regions of at least two signal channels in the plurality of signal channels arranged in the first direction are different, the first direction is parallel to the reference plane and the base substrate, and the second direction is perpendicular to the first direction (U).

7. The display apparatus according to claim 6, wherein a surface of the base substrate facing the display panel has two opposite and parallel first edges and two opposite and parallel second edges, the two first edges extend in the first direction, the two second edges extend in the second direction, the base substrate also has the axis, and the axis is parallel to the second direction and bisects any of the two first edges; and a size of configuration information provided by the driving circuit to the light regions of a signal channel closer to the axis in the plurality of signal channels is less than a size of configuration information provided by the driving circuit to a light region of the signal channel farther away from the axis in the plurality of signal channels.

8. The display apparatus according to claim 7, wherein sizes of the configuration information provided by the driving circuit to the plurality of light regions disposed in the same signal channel are the same.

9. The display apparatus according to claim 8, wherein the display apparatus further comprises a plurality of driving sub-circuits, and each driving sub-circuit is connected with light-emitting elements in at least one light region; and wherein for each driving sub-circuit, the driving sub-circuit is configured to receive configuration information provided by the driving sub-circuit, and control brightness of the light-emitting elements in the light region connected to the driving sub-circuit after processing the configuration information.

10. The display apparatus according to claim 1, wherein the backlight module has a plurality of signal channels arranged in the first direction, each signal channel extends in the second direction, each signal channel comprises a plurality of light regions, each light region has at least two light-emitting elements therein, and the plurality of light regions are arranged in an array in the first direction and the second direction;

the display apparatus further comprises a driving circuit, the driving circuit is connected with the backlight module and configured to provide configuration information to the plurality of light regions of each signal channel of the backlight module, and a size of the configuration information configured for each light region is positively related to a maximum brightness to be achieved by the light region; and wherein sizes of configuration information provided by the driving circuit to at least two light regions in the plurality of light regions arranged in the first direction are different, the plurality of light-emitting elements are arranged at unequal intervals in the first direction, the first direction is parallel to the reference plane and the base substrate, and the second direction is perpendicular to the first direction.

11. The display apparatus according to claim 1, wherein a distance in the second direction between any two adjacent light-emitting elements arranged in the second direction in the plurality of light-emitting elements is the same.

12. The display apparatus according to claim 1, wherein the display apparatus further comprises a plurality of support columns disposed between the backlight module and the display panel, and the plurality of support columns are configured to support the display panel.

13. The display apparatus according to claim 12, wherein the plurality of support columns arranged in the first direction in the plurality of support columns are arranged at unequal intervals, and have different lengths in a direction perpendicular to a bearing surface of the base substrate.

14. The display apparatus according to claim 13, wherein a distance in the first direction between two adjacent support columns closer to an axis of the base substrate in the plurality of support columns is greater than a distance in the first direction between two adjacent support columns farther away from the axis in the plurality of support columns; and a length of a support column closer to the axis in the plurality of support columns in a direction perpendicular to the base substrate is less than a length of a support column farther away from the axis in the plurality of support columns in the direction perpendicular to the base substrate.

15. The display apparatus according to claim 1, wherein the display apparatus further comprises an optical module; and the optical module is disposed between the display panel and the backlight module and is configured to adjust the backlight provided by the backlight module to the display panel.

* * * * *